(12) United States Patent
Shields et al.

(10) Patent No.: US 8,094,503 B2
(45) Date of Patent: Jan. 10, 2012

(54) METHOD OF PROGRAMMING AN ARRAY OF NMOS EEPROM CELLS THAT MINIMIZES BIT DISTURBANCES AND VOLTAGE WITHSTAND REQUIREMENTS FOR THE MEMORY ARRAY AND SUPPORTING CIRCUITS

(75) Inventors: Jeffrey A. Shields, Chandler, AZ (US); Kent D. Hewitt, Chandler, AZ (US); Donald S. Gerber, Scottsdale, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 12/854,504

(22) Filed: Aug. 11, 2010

(65) Prior Publication Data

US 2010/0302857 A1 Dec. 2, 2010

Related U.S. Application Data

(60) Division of application No. 12/331,542, filed on Dec. 10, 2008, now Pat. No. 7,817,474, which is a continuation-in-part of application No. 11/421,734, filed on Jun. 1, 2006, now Pat. No. 7,466,591.

(51) Int. Cl.
*G11C 16/04* (2006.01)

(52) U.S. Cl. ......... 365/185.18; 365/185.02; 365/185.27; 365/185.28

(58) Field of Classification Search .............. 365/185.02
See application file for complete search history.

(56) References Cited

U.S. PATENT DOCUMENTS

| | | | | |
|---|---|---|---|---|
| 5,235,544 A | | 8/1993 | Caywood | 365/185 |
| 5,341,432 A * | | 8/1994 | Suzuki et al. | 704/211 |
| 5,457,652 A * | | 10/1995 | Brahmbhatt | 365/185.27 |
| 5,487,033 A * | | 1/1996 | Keeney et al. | 365/185.19 |
| 5,576,995 A * | | 11/1996 | Sato et al. | 365/185.27 |
| 5,598,369 A | | 1/1997 | Chen et al. | 365/185.27 |
| 5,657,271 A | | 8/1997 | Mori | 365/185.27 |
| 5,790,455 A | | 8/1998 | Caywood | 365/185.06 |
| 5,790,460 A | | 8/1998 | Chen et al. | 365/185.29 |
| 5,872,732 A * | | 2/1999 | Wong | 365/185.18 |
| 5,886,924 A | | 3/1999 | Kim et al. | 365/185.11 |
| 5,940,324 A * | | 8/1999 | Chi et al. | 365/185.27 |
| 5,956,271 A | | 9/1999 | Kaya | 365/185.18 |
| 5,978,276 A | | 11/1999 | Wong | 365/185.29 |
| 5,986,931 A | | 11/1999 | Caywood | 365/185.06 |
| 6,091,635 A | | 7/2000 | Chi et al. | 365/185.18 |
| 6,188,604 B1 * | | 2/2001 | Liu et al. | 365/185.11 |
| 6,201,732 B1 | | 3/2001 | Caywood | 365/185.05 |
| 6,222,761 B1 | | 4/2001 | Gerber et al. | 365/185.02 |

(Continued)

OTHER PUBLICATIONS

Extended European Search Report, EP11161082.0-2210, 4 pages, May 26, 2011.

(Continued)

*Primary Examiner* — Tan T. Nguyen
(74) *Attorney, Agent, or Firm* — King & Spalding L.L.P.

(57) ABSTRACT

A method for programming and erasing an array of NMOS electrically erasable programmable read only memory (EEPROM) cells that minimizes bit disturbances and high voltage requirements for the memory array cells and supporting circuits. In addition, the array of N-channel memory cells may be separated into independently programmable memory segments by creating multiple, electrically isolated P-wells upon which the memory segments are fabricated. The multiple, electrically isolated P-wells may be created, for example, by p-n junction isolation or dielectric isolation.

9 Claims, 8 Drawing Sheets

U.S. PATENT DOCUMENTS

| | | |
|---|---|---|
| 6,236,595 B1 | 5/2001 | Gerber et al. ............ 365/185.18 |
| 6,300,183 B1 | 10/2001 | Gerber et al. ................ 438/228 |
| 6,330,190 B1 | 12/2001 | Wang et al. .............. 365/185.28 |
| 6,347,054 B1 | 2/2002 | Wang et al. .............. 365/185.29 |
| 6,504,191 B2 | 1/2003 | Gerber et al. ................ 257/286 |
| 6,876,582 B2 | 4/2005 | Wang et al. .............. 365/185.29 |
| 7,075,140 B2 | 7/2006 | Spadea ........................ 257/315 |
| 7,397,699 B2 * | 7/2008 | Trinh ....................... 365/185.18 |
| 7,466,591 B2 | 12/2008 | Shields et al. ........... 365/185.18 |
| 7,738,299 B2 | 6/2010 | Kuriyama et al. ....... 365/185.18 |
| 2007/0140008 A1 | 6/2007 | Shields et al. ........... 365/185.11 |
| 2007/0280001 A1 | 12/2007 | Shields et al. ........... 365/185.29 |
| 2008/0266982 A1 | 10/2008 | Trinh ....................... 365/185.29 |

OTHER PUBLICATIONS

International Preliminary Report on Patentability, PCT/US2009/067348, 7 pages, Jun. 23, 2011.

* cited by examiner

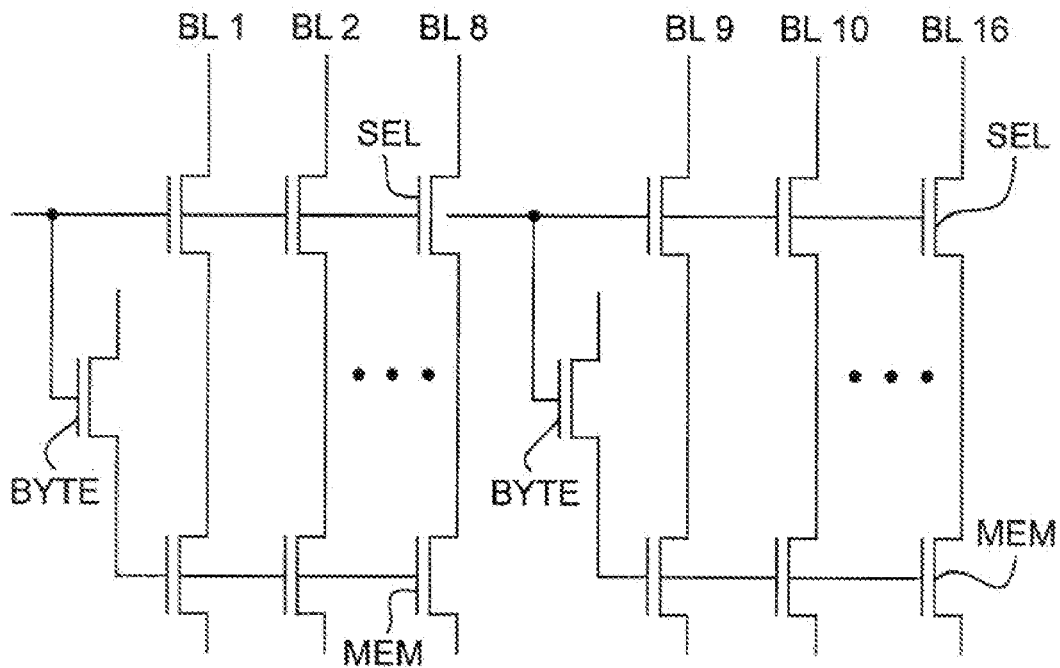
Figure 1 (Related Technology)
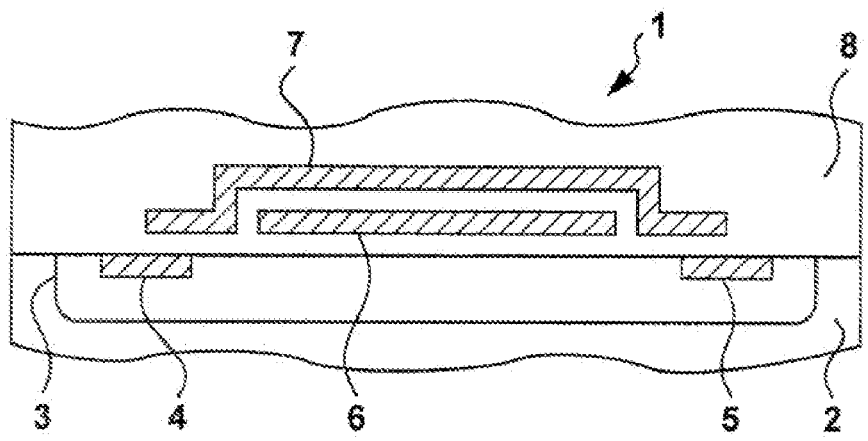
Figure 2 (Related Technology)

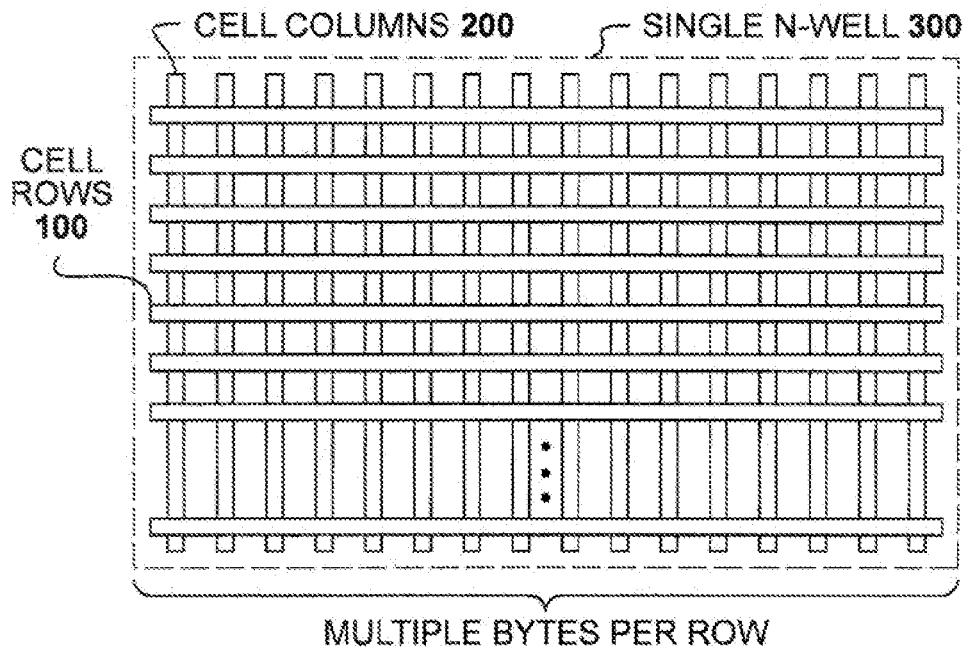
Figure 3 (Related Technology)
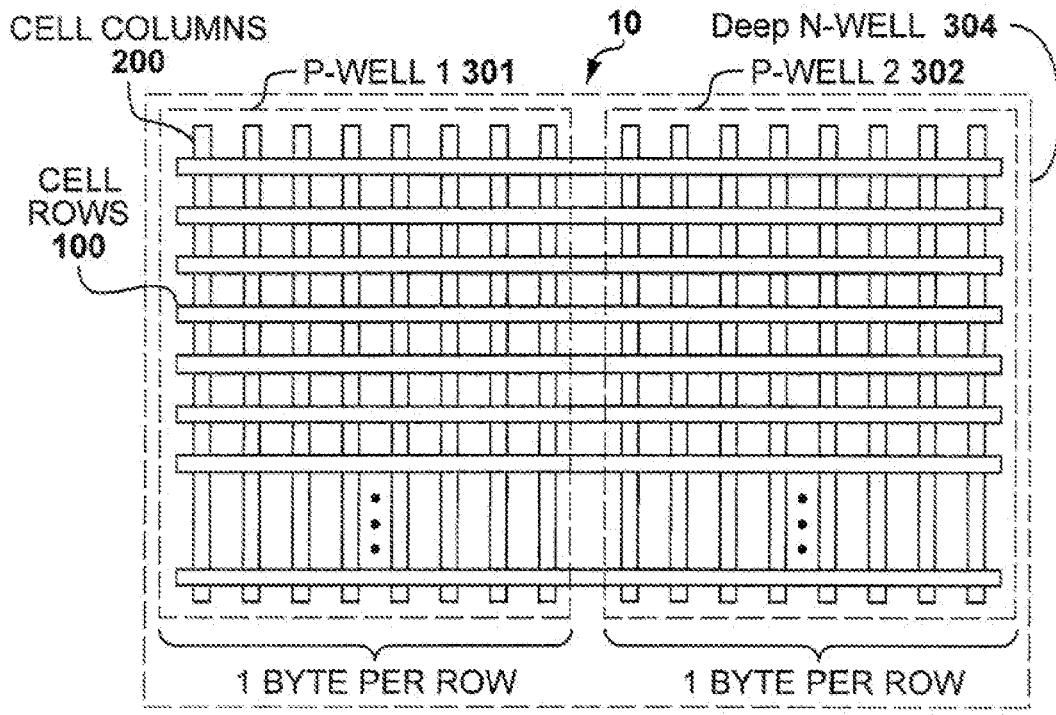
Figure 4

| | BL1 | BL2 | BL3 | BL4 | BL5 | BL6 | BL7 | BL8 | |
|---|---|---|---|---|---|---|---|---|---|
| | 0 | -11v | 0 | 0 | 0 | 0 | 0 | 0 | |
| 4v WL1 | C | E | C | C | C | C | C | C | |
| -7v WL2 | D | B | D | D | D | D | D | D | |
| -7v WL3 | D | B | D | D | D | D | D | D | |
| -7v WL4 | D | B | D | D | D | D | D | D | |
| -7v WL5 | D | B | D | D | D | D | D | D | |
| -7v WL6 | D | B | D | D | D | D | D | D | |
| -7v WL7 | D | B | D | D | D | D | D | D | |
| -7v WL8 | D | B | D | D | D | D | D | D | |
| | SL1 | SL2 | SL3 | SL4 | SL5 | SL6 | SL7 | SL8 | |

-11v SS Gate 1
-11v SS Drain 1

-11v P-Well 1

| | BL1 | BL2 | BL3 | BL4 | BL5 | BL6 | BL7 | BL8 |
|---|---|---|---|---|---|---|---|---|
| | 0 | 0 | 0 | 0 | 0 | 0 | 0 | 0 |
| | C | C | C | C | C | C | C | C |
| | D | D | D | D | D | D | D | D |
| | D | D | D | D | D | D | D | D |
| | D | D | D | D | D | D | D | D |
| | D | D | D | D | D | D | D | D |
| | D | D | D | D | D | D | D | D |
| | D | D | D | D | D | D | D | D |
| | D | D | D | D | D | D | D | D |
| | SL1 | SL2 | SL3 | SL4 | SL5 | SL6 | SL7 | SL8 |

-11v SS Gate 2
-11v SS Drain 2

-11v P-Well 2

4V Deep N-Well

NMOS EE Cell program operation with bit selectability

METHOD OF PROGRAMMING AN ARRAY OF NMOS EEPROM CELLS THAT MINIMIZES BIT DISTURBANCES AND VOLTAGE WITHSTAND REQUIREMENTS FOR THE MEMORY ARRAY AND SUPPORTING CIRCUITS

RELATED PATENT APPLICATIONS

This is a divisional application of and claims priority to commonly owned U. S. patent application Ser. No. 12/331, 542; now U.S. Pat. No. 7,817,474 filed Dec. 10, 2008; entitled "A Method for Programming and Erasing an Array of NMOS EEPROM Cells That Minimizes Bit Disturbances and Voltage Withstand Requirements for the Memory Array and Supporting Circuits," by Jeffrey A. Shields, Kent D. Hewitt and Donald S. Gerber; which is a continuation-in-part application of patent application Ser. No. 11/421,734 filed on Jun. 1, 2006 and claims priority to commonly owned U.S. Pat. No. 7,466, 591; issued Dec. 16, 2008; all of which are hereby incorporated by reference herein for all purposes.

TECHNICAL FIELD

The present disclosure relates to semiconductor devices, and more specifically to N-channel Electrically Erasable Programmable Read Only Memory (EEPROM) (hereinafter memory) devices that may be programmed and erased with minimum bit disturbances and voltage withstand requirements for the memory array cells and supporting circuits.

BACKGROUND

A common practice in fabricating Electrically Erasable Programmable Read Only Memory (EEPROM) was to produce N-channel cells over a P-well substrate because of a simpler manufacturing process and lower programming voltages. The approach used by Caywood; as disclosed in U.S. Pat. No. 5,986,931, entitled "Low Voltage Single Supply CMOS Electrically Erasable Read-Only Memory" which is a continuation-in-part of U.S. Pat. No. 5,790,455. and U.S. Pat. No. 5,986,931 (Caywood 2) and U.S. Pat. No. 5,790,455 (Caywood 1), incorporated by reference herein for all purposes; produces precisely the opposite configuration, i.e., P-channel devices over an N-well, which itself resides in a P-type substrate. The novelty of the Caywood approach is the reduction in magnitude of the applied voltage required for erasing and writing to the device while maintaining a similar writing speed as found in the related technology prior to Caywood as well as the elimination of certain components functionally necessary in the related technology.

Referring to FIG. 1, the N-channel memory device related technology is illustrated. Each memory transistor (MEM) required a row select transistor (SEL), which controlled the data received from the bit lines (BL). Also, if byte addressing was desired, then the device included a byte select transistor (BYTE) for every eight memory transistors. The problem solved by Caywood with the advent of a P-channel/N-well device was the elimination of the row select transistors. Even after Caywood, byte selection still required the presence of the byte select transistors. The elimination of the byte select transistors resulted in the undesirable effect that the entire row must be reprogrammed following an erase operation.

Referring to FIG. 2, the Caywood approach is illustrated in general terms for a single memory transistor 1. The N-well 3 is created within a P-type substrate 2. The P-channel for the drain 4 and source 5 is created within the N-well 3. Poly 1 or the floating gate 6 of the memory transistor 1 is created after the active region for the drain 4 and source 5. Poly 2 or the control electrode 7 of the memory transistor is fabricated over the floating gate. Various non-conductive layers 8 insulate the P-channel 4 and 5, the floating gate 6 and the control electrode 7 from each other.

FIG. 3 illustrates a plurality of cell rows 100, typically connected to gate electrodes of memory transistors and a plurality of columns 200 typically connected to source and drain electrodes of memory transistors in the array, with both cell rows and cell columns existing on a single N-well 300 substrate. The limitation to the Caywood P-channel memory arrays, as shown in FIG. 3, is that all memory cells in any particular row must be selected, thus written or erased, during a particular operation.

Alternatively stated, as disclosed by Caywood, the cell rows are not segmented such that some memory cells in the cell row may be selected for writing while other memory cells in the row are not. Thus, in order to program the contents of a single memory cell, the entire cell row must then be programmed in order to change the data in one memory cell.

In many applications it is desired to change the data in the memory array, one byte at a time. In the N-channel device prior art, this feature was accomplished by the inclusion of a byte select transistor (BYTE) for each eight memory transistors as shown in FIG. 1. The disadvantage of this approach is the increased demand for silicon area to accommodate the overhead of the byte select transistor (BYTE). For example, from solely a transistor perspective, a byte select transistor (BYTE) for every eight memory transistors requires an 11 percent overhead (i.e., ⅑).

Moreover, the capability of changing one byte at a time would give an endurance advantage over row select memory arrays because only one byte of cells would need to undergo the electrical stress of the programming cycle as opposed to the entire row. It is well known to those skilled in the art of semiconductor memory fabrication that one cause of EEPROM failure is attributable to excessive erase/write operations.

As the memory cell and supporting circuitry transistor circuits are fabricated with smaller geometries, voltage breakdown becomes more of a problem. Since the erase and write operations require relatively high voltages in comparison to read operations, the smaller geometry circuit elements are more voltage stressed than were older technology memory cells and supporting circuitry that used larger geometry transistors.

SUMMARY

Therefore there is a need for a way of programming and erasing an array of NMOS EEPROM cells that minimizes bit disturbances during programming and erasing, and minimizes the voltage withstand requirements for the memory array and supporting circuitry by biasing the cell elements for lowest voltage stress.

In addition, byte selectability may be advantageously used for N-channel/P-well EEPROM technology by providing independently programmable memory segments within the EEPROM array other than with byte select transistors. This may be accomplished by providing an N-channel/P-well electrically erasable programmable read only memory array that is divided into independently programmable memory segments within a memory array by fabricating a plurality of P-wells within a deep N-well of the array or by segmenting the P-well of the array into sub-P-wells in the deep N-well. The independently programmable memory segments are achieved without the necessity for byte select transistors. Creating a plurality of P-wells within a deep N-well may be done with p-n junction isolation. Segmenting a P-well of the memory array may done by dielectric isolation.

According to this disclosure, a memory array may comprise a plurality of P-wells within a deep N-well that is in a P-type substrate and each of the plurality of P-wells comprises a plurality of independently programmable memory segments. Each independently programmable memory segment is comprised of M memory cell columns and N memory cell rows. Each independently programmable memory segment may reside within a unique and separate P-well. Thus, each P-well contains an independently programmable memory segment.

A memory array may comprise a P-well within a deep N-well that is within a P-type substrate wherein the P-well is segmented into a plurality of electrically isolated sub P-wells, M memory transistor columns within each of the plurality of electrically isolated sub P-wells and N memory transistor rows within each of the plurality of electrically isolated sub P-wells.

A combination of positive and negative biases on the memory cell and support circuitry transistor elements, P-wells and deep N-well are used during write and erase operations for reducing voltage potential withstand requirements between the elements. For example, for a fifteen (15) volt programming method, use of approximately a four (4) volt bit line bias during program and erase operations minimizes cell disturbance and reduces cell junction voltage requirements to approximately eleven (11) volts. Use of approximately a four (4) volt word line bias during a program operation minimizes cell disturbance. Use of separate source select transistor biasing for each P-well during program and erase operations, with the drain and gate of each source select transistor coupled to the P-well voltage potential minimizes voltage withstand requirements for source select transistors. Use of approximately a four (4) volt word line bias during an erase operation minimizes voltage withstand requirements for row drivers.

Commonly owned U.S. Pat. Nos. 6,222,761 B1; 6,236,595 B1; 6,300,183 B1; and 6,504,191 B2; all by Gerber et al., disclose PMOS EEPROM having independently programmable memory segments, all of which are incorporated by reference herein for all purposes.

According to a specific example embodiment of this disclosure, a method of erasing selected ones of a plurality of memory segments of a memory array within a P-well in a deep N-well of a P-type substrate comprises the steps of setting the deep N-well to a positive voltage; setting the P-well to the positive voltage; setting a selected one of a plurality of word lines to a negative voltage; setting unselected ones of the plurality of word lines to substantially zero volts; setting a plurality of bit lines to the positive voltage; setting a source select gate line to the positive voltage; and setting a source select drain line to the positive voltage, wherein the selected ones of the plurality of memory segments within the P-well and coupled to the selected one of the plurality of word lines are erased.

According to another specific example embodiment of this disclosure, a method of erasing selected ones of a plurality of memory segments in a memory array comprising a plurality of P-wells in a deep N-well within a P-type substrate, wherein each of the plurality of memory segments resides within a respective one of the plurality of P-wells comprises the steps of setting the deep N-well to a first voltage; setting a selected one of the plurality of P-wells to a second voltage; setting unselected ones of the plurality of P-wells to a third voltage; setting a selected one of a plurality of word lines to a fourth voltage; setting unselected ones of the plurality of word lines to a fifth voltage; setting a first plurality of bit lines in the selected one of the plurality of P-wells to a sixth voltage; setting a second plurality of bit lines in the unselected ones of the plurality of P-wells to a seventh voltage; setting a first source select gate line associated with the selected one of the plurality of P-wells to an eighth voltage; setting a first source select drain line associated with the selected one of the plurality of P-wells to a ninth voltage; setting a second source select gate line associated with the unselected ones of the plurality of P-wells to a tenth voltage; setting a second source select drain line associated with the unselected ones of the plurality of P-wells to an eleventh voltage; wherein the selected ones of the plurality of memory segments within the selected one of the plurality of P-wells and coupled to the selected one of the plurality of word lines are erased.

According to yet another specific example embodiment of this disclosure, a method of programming at least one of a plurality of memory segments in a memory array comprising a plurality of P-wells in a deep N-well within a P-type substrate, wherein each of the plurality of memory segments resides within a respective one of the plurality of P-wells comprises the steps of: setting the deep N-well to a positive voltage; setting a selected one of the plurality of P-wells to a first negative voltage; setting unselected ones of the plurality of P-wells to a second negative voltage; setting a selected one of a plurality of word lines to the positive voltage; setting unselected ones of the plurality of word lines to the second negative voltage; setting a selected at least one of a plurality of bit lines to the first negative voltage; setting unselected ones of the plurality of bit lines to a third voltage; setting first source select gate lines of the selected one of the plurality of P-wells to the first negative voltage; setting first source select drain lines of the selected one of the plurality of P-wells to the first negative voltage; setting second source select gate lines of the unselected ones of the plurality of P-wells to the second negative voltage; and setting second source select drain lines of the unselected ones of the plurality of P-wells to the second negative voltage, wherein the selected at least one of the plurality of memory segments coupled to the selected one of the plurality of word lines and the selected at least one of the plurality of bit lines is programmed.

According to still another specific example embodiment of this disclosure, a method of A method of programming selected ones of a plurality of memory segments in a memory array comprising a plurality of P-wells in a deep N-well within a P-type substrate, wherein each of the plurality of memory segments resides within a respective one of the plurality of P-wells comprises the steps of: setting the deep N-well to a first voltage; setting a one of the plurality of P-wells to a second voltage; setting other ones of the plurality of P-wells to a third voltage; setting a one of a plurality of word lines to a fourth voltage; setting other ones of the plurality of word lines to a fifth voltage; setting at least one of a plurality of bit lines to a sixth voltage; setting other ones of the plurality of bit lines to a seventh voltage; setting first source select gate lines associated with the one of the plurality of P-wells to an eighth voltage; setting first source select drain lines associated with the one of the plurality of P-wells to a ninth voltage; setting second source select gate lines associated with the other ones of the plurality of P-wells to an tenth voltage; and setting second source select drain lines associated with the other ones of the plurality of P-wells to an eleventh voltage, wherein the selected ones of the plurality of memory segments coupled to the one of the plurality of word lines and the at least one of the plurality of bit lines are programmed.

BRIEF DESCRIPTION OF THE DRAWINGS

A more complete understanding of the present disclosure thereof may be acquired by referring to the following description taken in conjunction with the accompanying drawings wherein:

FIG. 1 is a schematic diagram of byte selectable N-channel memory cells in a related technology incorporating byte select transistors and row select transistors;

FIG. 2 is a cross section of a related technology P-channel memory transistor;

FIG. 3 is a schematic illustration of a related technology in which the matrix of P-channel memory transistors resides in a single N-well;

FIG. 4 is a schematic illustration of an N-channel memory array comprising two P-wells within a deep N-well and each P-well having an independently programmable memory segment, according to a specific example embodiment of the present disclosure;

FIGS. 9A and 9B are voltage matrix charts for a bit program operation of the N-channel memory array circuit illustrated in FIG. 7, according to specific example embodiments of the present disclosure.

Figure 5:
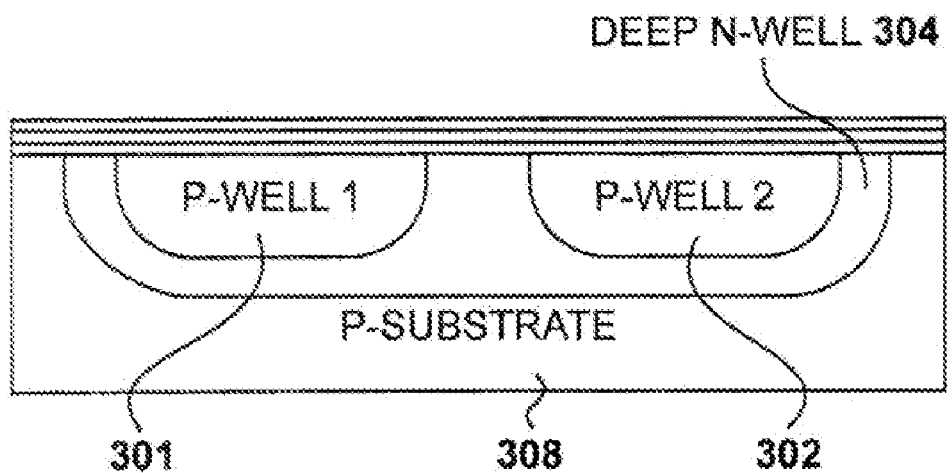
FIG. 5 is a schematic cross section elevational view of a specific example embodiment for a plurality of P-wells within a deep N-well as illustrated in FIG. 4.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

Referring now to the drawings, the details of example embodiments are schematically illustrated. Like elements in the drawings will be represented by like numbers, and similar elements will be represented by like numbers with a different lower case letter suffix.

Referring to FIG. 4, depicted is a schematic illustration of an N-channel memory array comprising two P-wells within a deep N-well and each P-well having an independently programmable memory segment, according to a specific example embodiment of the present disclosure. The N-channel memory array, generally represented by the numeral 10, comprises a plurality of P-wells (e.g., 301 and 302) within a deep N-well 304, (e.g., see FIGS. 5 and 6) and a plurality of independently programmable memory segments. Each independently programmable memory segment is comprised of a matrix of memory cell transistors shown as cell rows 100 and cell columns 200. The embodiment of FIG. 4 segments the 16 cell columns 200 and the plurality of cell rows 100 of the memory array 10 into two independently programmable memory segments residing within the P-wells 301 and 302, respectively, and shown in dashed lines. P-wells 301 and 302 are electrically separated from each other.

In the specific example embodiment of the present disclosure, there are eight memory transistor columns within each P-well segment, thereby comprising byte (8 bit) segments. There are a common number of cell rows 100 within each P-well and the total number of rows 100 is determined by the desired size of the memory array 10. In FIG. 4, N rows of memory transistors are illustrated. Not shown in FIG. 4, but discussed below and shown in subsequent diagrams, are source select transistors (see source select transistors 501-516 in FIG. 7) at the bottom of each column 200 of the array 10.

In the embodiment shown in FIG. 4, only two P-wells and two independently programmable memory segments are shown in byte format, e.g., 8 cell columns per memory segment, or a total of 16 cell columns. However, those skilled in the art will recognize that additional P-well segmentations are possible thus yielding additional independently programmable memory segments in byte format. Thus, for a byte format memory array 10, the number of independently programmable memory segments multiplied by eight, e.g., the number of cell columns 200 per memory segment, equals the total number of cell columns 200 in the array 10.

Furthermore, each of the independently programmable memory segments which may be comprised of M cell columns, where M is either smaller or larger than a byte. The number M of cell columns 200, alternative to the byte format, include, but are not limited to: 2, 4, 16, 32, 64, etc., cell columns 200 for each independently programmable memory segment. These various memory array 10 geometries are easily implemented according to the specific example embodiments of this disclosure.

Each independently programmable memory segment may be comprised of a plurality of independently programmable memory units. An independently programmable memory unit is defined as those cell columns 200 which are common to a given cell row 100 and within a single independently programmable memory segment. The intersection of a cell column 200 and a cell row 100 defines a memory cell which may be a single memory transistor. Thus, for the specific example embodiment geometry illustrated in FIG. 4, each independently programmable memory unit is comprised of eight memory cells. Furthermore, the total number of independently programmable memory units for a given independently programmable memory segment is equal to the total number (N) of cell rows 100.

The functional relevance of the independently programmable memory unit may be as follows. A single independently programmable memory unit defines the smallest or most narrow portion of the memory array 10 that may be addressed by the write and erase memory operations described below. Additionally, all independently programmable memory units within a common cell row 100 may be simultaneously addressed by the read, write and erase memory operations.

Referring to FIG. 5, depicted is a schematic cross section elevational view of a specific example embodiment for a plurality of P-wells within a deep N-well as illustrated in FIG. 4. P-well 301 and P-well 302 are formed in a deep N-well 304. The deep N-well 304 is formed in a P-type substrate 308.

Figure 6:
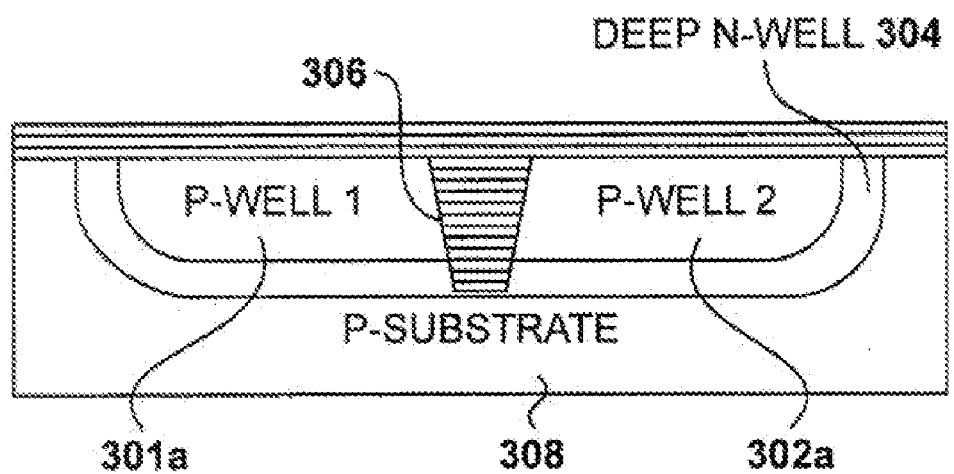
FIG. 6 is a schematic cross section elevational view of a specific example embodiment of P-well segmentation trenching of N-wells illustrated in FIG. 4.

Referring to FIG. 6, depicted is a schematic cross section elevational view of a specific example embodiment of P-well segmentation trenching of N-wells as illustrated in FIG. 4. P-well 301a and P-well 302a are formed by dividing a single P-well with a trench 306 extending into the deep N-well 304 and filled with an insulating material. The deep N-well 304 is formed in a P-type substrate 308.

Figure 7:
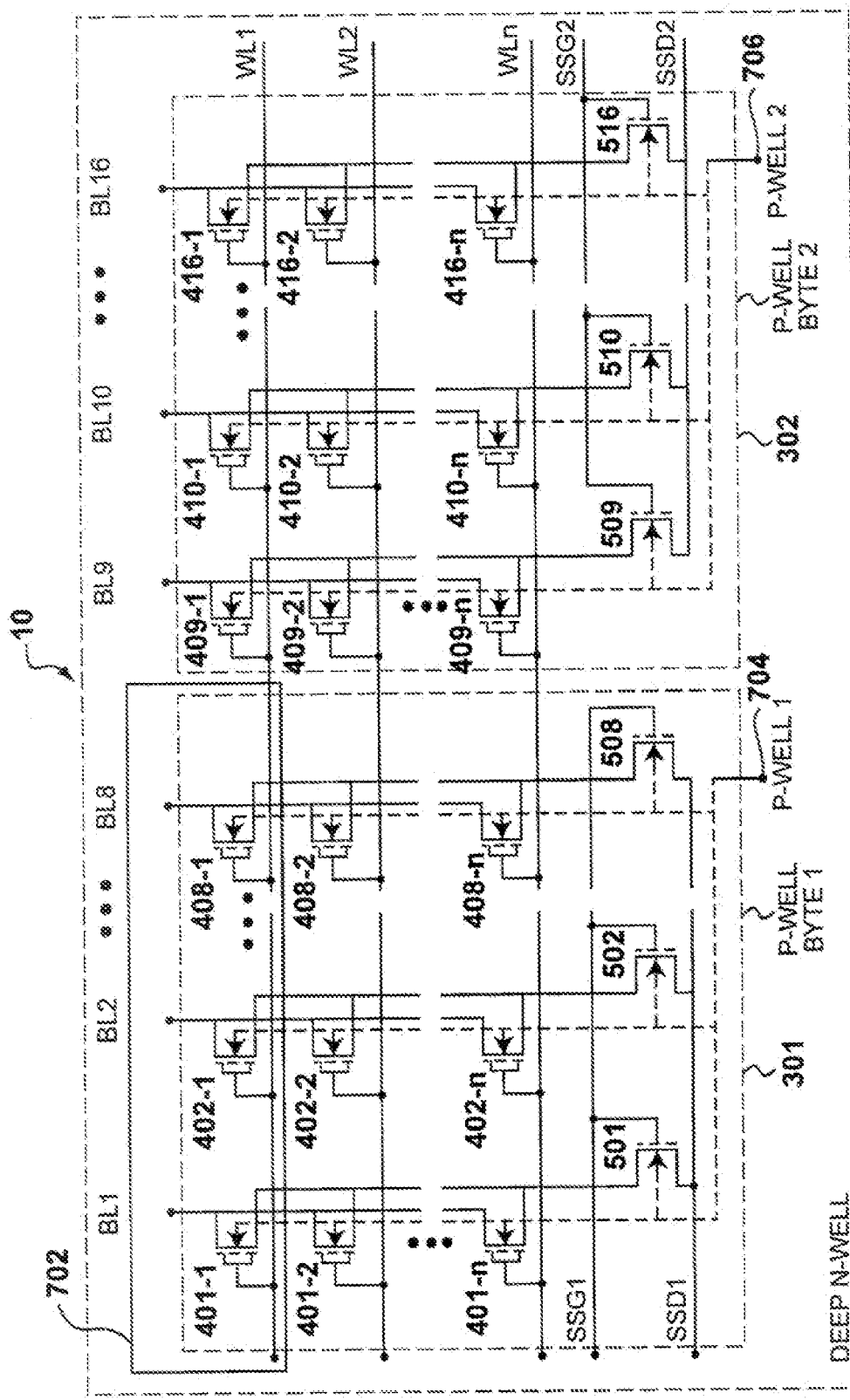
FIG. 7 is a schematic circuit diagram of the N-channel memory array illustrated in FIG. 4, according to a specific example embodiment of the present disclosure.

Referring to FIG. 7, depicted is a schematic circuit diagram of the N-channel memory array illustrated in FIG. 4, according to a specific example embodiment of the present disclosure. The memory array 10 is comprised of a plurality of N channel memory transistors 401-1 to 416-n which are laid out in a typical column/row matrix. Also shown are a row of N-channel source select transistors 501-516. Only one source select transistor 501-516 is necessary for each bit line BL1-BL16.

Two separate P-wells with accompanying independently programmable memory segments are shown in dashed lines drawn around a group of cells. Contained within P-well 301 are 8 memory transistor columns (only three are shown for clarity) and N memory transistor rows. P-well 302 is identical to P-well 301, however, P-well 302 is electrically isolated from P-well 301. Note that each independently programmable memory segment corresponds to a P-well and thus, the quantity of P-wells is equal to the quantity of independently programmable memory segments. The upper left independently programmable memory unit in P-well 301 is enclosed in a solid line box 702 to indicate that this is the target independently programmable memory unit (e.g., target byte) for the write, erase, and read operations described herein below.

The control electrodes of the N-channel memory transistors 401-1 to 416-n for each row are connected to common word lines WL1 to WLn, respectively. The drain electrodes of the memory transistors of any particular column are connected to a common bit lines BL1-BL16, respectively. The source electrodes of each memory transistor in a particular column are commonly connected to a respective one of the source select transistors 501-516 (SL1-SL16). The source select transistors for each P-well are controlled by two control lines SSG and SSD, connected to the gates and drains, respectively, of the source select transistors. Hence, source select transistors 501-508 in P-well 301 are controlled by the control lines SSG1 and SSD1, and source select transistors 509-516 in P-well 302 are controlled by the control lines SSG2 and SSD2. Voltage potentials at P-well 301 and P-well 302 may also be independently controlled, as represented by node 704 and 706, respectively, for independent selection of an erase, program or read operation of only a memory segment contained within a certain P-well. However, it is contemplated and within the scope of the present disclosure that there may be only one P-well in a deep N-well of an NMOS EEPROM using the voltage combinations for selection of a byte erase, bit program or read operation.

In this disclosure the IEEE standard 1005 will be followed for consistent nomenclature. Writing or programming a memory cell bit is defined as placing electrons onto the floating gate of the memory transistor. Erasing is defined as removing electrons from the floating gate of the memory transistor. The various writing, erasing and reading operations are performed by applying different combinations of voltages onto the word lines WLx, bit lines BLx, source select transistor gates SSGx, source select transistor drains SSDx, and P-wells, as described herein more fully below.

Figure 8A:
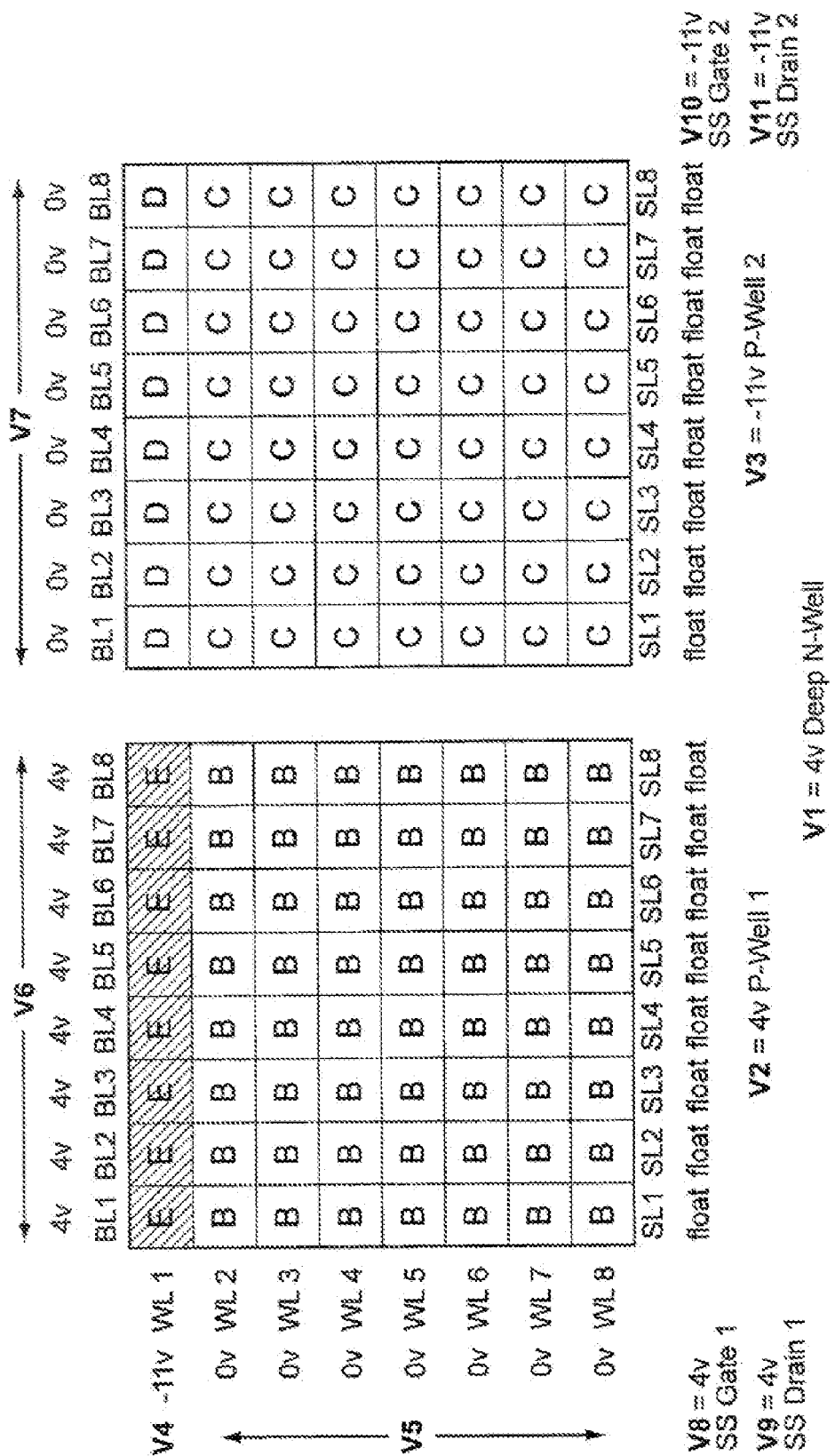
FIGS. 8A and 8B are voltage matrix charts for byte erase operations of the N-channel memory, array circuit illustrated in FIG. 7, according to specific example embodiments of the present disclosure.
Figure 8B:
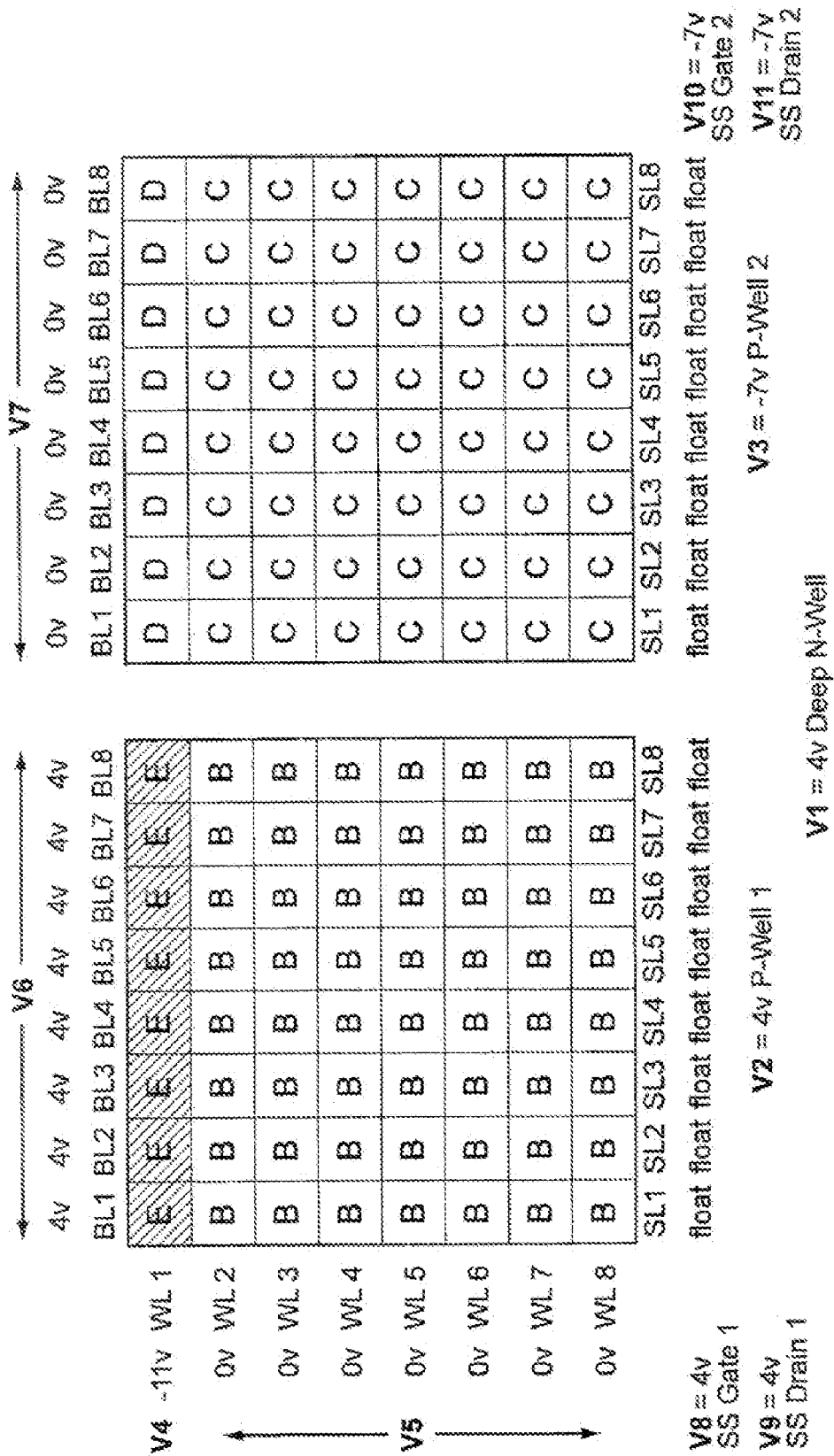

Referring to FIGS. 8A and 8B, depicted are voltage matrix charts for byte erase operations of the N-channel memory array circuit illustrated in FIG. 7, according to specific example embodiments of the present disclosure. For an erase operation, the word line WLx may be either at ground potential, e.g., zero (0) volts, or at some relatively high programming voltage, e.g., approximately minus eleven (−11) volts. For erasing the target independently programmable memory unit (e.g., target byte), the gates of the memory transistors 401-1 to 416-1 (FIG. 7) are driven to approximately −11 volts over the WL1 control line. The electric field resulting from a relatively high voltage potential, in relation to the P-well 301 biased to approximately 4 volts, causes electrons to tunnel from the floating gate across the dielectric layer and to the P-well of the transistors 401-1 to 408-1 (FIG. 7), thus erasing the transistors 401-1 to 408-1 (FIG. 7).

Conversely, using WL2 as an example, the control electrodes of memory transistors 401-2 to 408-2 are biased at approximately 0 volts, and the P-well 301 is biased at approximately 4 volts. Under these conditions, no tunneling occurs because of an absence of a sufficient electric field between these memory transistors 401-2 to 408-2 and the P-well 301. Thus, memory transistors 401-2 to 408-2 are not erased.

With respect to memory transistors 409-2 to 416-2, the P-well 302 is at approximately −11 volts (FIG. 8A) or −7 volts (FIG. 8B), and the control electrodes at approximately zero (0) volts potential result in a N-type inversion layer under the poly 2 layer of each of the memory transistors 409-2 to 416-2. With BL9-16 at approximately 0 volts and the drain electrodes of memory transistors 409-2 to 416-2 tied to the inversion layer, there is no voltage potential between the control electrode and the inversion layer at the surface of the P-well 302. Thus even with the P-well 302 biased to approximately −11 volts (FIG. 8A) or −7 volts (FIG. 8B), no tunneling occurs thereby precluding an erase operation for memory transistors 409-2 to 416-2.

For the erase operation, the bit line to each of the columns BL1:8 is set to approximately 4 volts, each of the columns BL9:16 is set to approximately 0 volts, SSG1 and SSD1 for the select transistors 501-508 are set to approximately 4 volts, and the P-well 301 is biased to 4 volts. This permits a sufficient voltage potential between the floating gate of the memory transistors 401-1 to 408-1, controlled by WL1 at approximately −11 volts and the P-well 301 at approximately 4 volts (a difference in potential of approximately 15 volts). Electrons tunnel from the floating gate across the dielectric layer to the P-well 301, this positively charging the floating gate. Conversely, P-well 302, and the select lines SSG2 and SSD2 are biased to approximately −11 volts (FIG. 8A) or −7 volts (FIG. 8B); thereby failing to create a sufficient voltage potential between the control electrodes of the memory transistors 409-1 to 416-1 that are within P-well 302. Without a sufficient voltage differential, tunneling cannot occur and the erase cycle is not accomplished. Thus, by providing for separate and isolated P-wells, the N-channel memory transistors in any row may be organized in byte selectable segments where byte selection is effected, at least in part, by the application of, or biasing at, different voltage potentials, the plurality of the P-wells themselves.

Figure 9B:
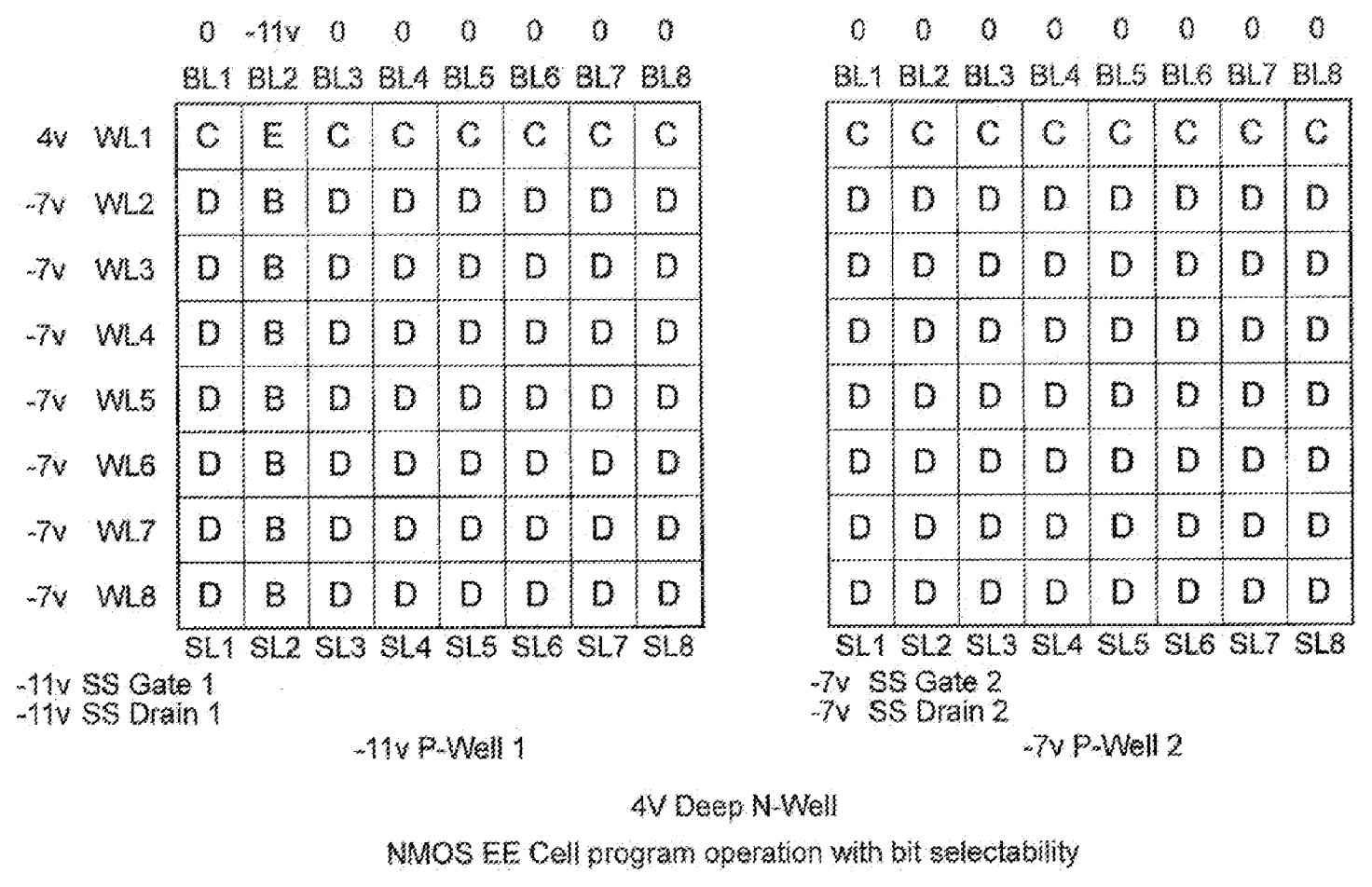

Referring to FIGS. 9A and 9B, depicted are voltage matrix charts for a bit program operation of the N-channel memory array circuit illustrated in FIG. 7, according to specific example embodiments of the present disclosure. In these examples, word line WL1 is biased to approximately 4 volts, the remainder of the word lines WL2:n are biased to approximately −7 volts; the P-well 301, and select lines SSG1 and SSD1 are biased to approximately −11 volts (FIG. 9A); and the P-well 302, and the select lines SSG2 and SSD2 are biased to approximately −7 volts (FIG. 9B). The floating gates of the memory transistors 401-1 through 416-1 are capacitively coupled to a voltage sufficient to turn these transistors on hard, thereby creating an inversion layer. Bit line BL2 is biased to approximately −11 volts while bit lines BL1 and BL3:16 are biased to approximately 0 volts. This causes the inversion layer under the floating gate and pass gate of transistor 402-1 to be biased at −11 volts and the inversion layer under the floating gates and pass gates of transistors 401-1 and 403-1 through 416-1 to be biased at 0 volts. This creates a sufficient electric field to cause electron tunneling from the inversion region in the P-well 301 to the floating gate of the transistor 402-1 and thus charges the floating gate of the memory transistor 402-1, but not the other floating gates (refer to FIG. 7).

Conversely, with WL1 biased to approximately 4 volts and bit lines BL1 and BL3:16 biased to approximately 0 volts, there is insufficient electric field for electron tunneling from the inversion region to the floating gate for memory transistors 401-1 and 403-1 to 416-1. Thus, the write operation is not accomplished for memory transistors 401-1 and 401-3 to 416-1. In the target independently programmable memory unit (e.g., target byte 702) of FIG. 7, identified by the rectangle, a binary pattern may be entered into the memory cells 401-1 through 408-1 by setting the appropriate bit lines BL1:BL8 to approximately −11 volts or 0 volts. Bit lines set to approximately −11 volts will write the memory cell. Bit lines set to substantially ground or approximately zero volts will remain in an unchanged state.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. A method of programming at least one of a plurality of memory segments in a memory array comprising a plurality of P-wells in a deep N-well within a P-type substrate, wherein each of the plurality of memory segments resides within a respective one of the plurality of P-wells, said method comprising the steps of:
   setting the deep N-well to a positive voltage;
   setting a selected one of the plurality of P-wells to a first negative voltage;
   setting unselected ones of the plurality of P-wells to a second negative voltage;
   setting a selected one of a plurality of word lines to the positive voltage;
   setting unselected ones of the plurality of word lines to the second negative voltage;
   setting a selected at least one of a plurality of bit lines to the first negative voltage;
   setting unselected ones of the plurality of bit lines to a third voltage;
   setting first source select gate lines of the selected one of the plurality of P-wells to the first negative voltage;
   setting first source select drain lines of the selected one of the plurality of P-wells to the first negative voltage;
   setting second source select gate lines of the unselected ones of the plurality of P-wells to the second negative voltage; and
   setting second source select drain lines of the unselected ones of the plurality of P-wells to the second negative voltage,
   wherein the selected at least one of the plurality of memory segments coupled to the selected one of the plurality of word lines and the selected at least one of the plurality of bit lines is programmed.

2. The method according to claim 1, wherein the positive voltage is approximately 4 volts, the first negative voltage is approximately −11 volts, the second negative voltage is approximately −7 volts, and the third voltage is substantially zero volts.

3. The method according to claim 1, wherein the number of the selected at least one of the plurality of memory segments comprises any positive integer number of bits per byte.

4. The method according to claim 1, wherein unselected ones of the plurality of memory segments are coupled to the unselected ones of the plurality of word lines.

5. The method according to claim 1, wherein unselected ones of the plurality of memory segments are within the unselected ones of the plurality of P-wells.

6. The method according to claim 1, wherein:
   the positive voltage is from about zero volts to about 20 volts;
   the first negative voltage is from about 10 volts to about 20 volts less positive than the positive voltage;
   the second negative voltage is from about zero volts to about 6 volts more positive than the first negative voltage; and
   the third voltage is from about zero volts to about 6 volts less positive than the positive voltage.

7. A method of programming selected ones of a plurality of memory segments in a memory array comprising a plurality of P-wells in a deep N-well within a P-type substrate, wherein each of the plurality of memory segments resides within a respective one of the plurality of P-wells, said method comprising the steps of:
   setting the deep N-well to a first voltage;
   setting a one of the plurality of P-wells to a second voltage;
   setting other ones of the plurality of P-wells to a third voltage;
   setting a one of a plurality of word lines to a fourth voltage;
   setting other ones of the plurality of word lines to a fifth voltage;
   setting at least one of a plurality of bit lines to a sixth voltage;
   setting other ones of the plurality of bit lines to a seventh voltage;
   setting first source select gate lines associated with the one of the plurality of P-wells to an eighth voltage;
   setting first source select drain lines associated with the one of the plurality of P-wells to a ninth voltage;
   setting second source select gate lines associated with the other ones of the plurality of P-wells to an tenth voltage; and
   setting second source select drain lines associated with the other ones of the plurality of P-wells to an eleventh voltage,
   wherein the selected ones of the plurality of memory segments coupled to the one of the plurality of word lines and the at least one of the plurality of bit lines are programmed.

8. The method according to claim 7, wherein:
   the first and fourth voltages are approximately 4 volts;
   the second, sixth, eighth and ninth voltages are approximately −11 volts;
   the third, fifth, tenth and eleventh voltages are approximately −7 volts; and
   the seventh voltage is approximately 0 volts.

9. The method according to claim 7, wherein:
the first voltage is substantially equal to or more positive than zero volts;
the second, sixth, eighth and ninth voltages are from about 10 volts to about 20 volts less positive than the fourth voltage;
the third, fifth, tenth and eleventh voltages are from about zero volts to about 6 volts more positive than the second voltage
the fourth voltage is from about zero volts to about 20 volts;
the seventh voltage is from about zero volts to about 6 volts less positive than the fourth voltage;
the eighth voltage is substantially equal to or less positive than the second voltage plus a source select transistor threshold voltage;
the ninth voltage is substantially equal to or more positive than the second voltage
the tenth voltage is substantially equal to or less positive than the third voltage plus a source select transistor threshold voltage; and
the eleventh voltage is substantially equal to or more positive than the third voltage.

* * * * *